United States Patent [19]

Tricker

[11] 3,927,471

[45] Dec. 23, 1975

[54] ELECTRONIC CIRCUITS

[76] Inventor: Keith Arthur Tricker, High St., Cavendish, Sudbury, Suffolk, England

[22] Filed: Jan. 28, 1974

[21] Appl. No.: 437,305

[30] Foreign Application Priority Data

Feb. 2, 1973 United Kingdom ................ 5289/73

[52] U.S. Cl. ...................... 29/625; 29/626; 29/628; 174/68.5; 317/101 CC

[51] Int. Cl.$^2$ ......................................... H05K 3/32

[58] Field of Search ......... 29/625, 626, 628, 630 D, 29/203 R, 203 DS, 203 DT, 203 D; 174/68.5; 317/101 C, 101 CC; 339/17 R, 17 B, 17 C, 253 R, 256 S, 271, 269, 268 S, 270 R, 273 R, 273 S, 275 B, 276 S; 72/402, DIG. 1, DIG. 10

[56] References Cited

UNITED STATES PATENTS

| | | | |
|---|---|---|---|
| 2,969,521 | 1/1961 | Scoville | 29/626 UX |
| 3,190,953 | 6/1965 | Keller | 174/68. 5 |
| 3,217,584 | 11/1965 | Amesbury | 174/68.5 UX |
| 3,233,034 | 2/1966 | Grabbe | 174/68.5 |
| 3,249,908 | 5/1966 | Fuller et al. | 174/68.5 UX |
| 3,325,691 | 6/1967 | Dahlgren et al. | 29/626 UX |
| 3,445,929 | 5/1969 | Wolf | 29/625 |
| 3,447,039 | 5/1969 | Branagan | 29/626 UX |
| 3,452,149 | 6/1969 | Rinaldi | 29/626 X |
| 3,504,328 | 3/1970 | Olsson | 339/17 C |
| 3,777,303 | 12/1973 | McDonough | 29/626 X |

*Primary Examiner*—Milton S. Mehr
*Assistant Examiner*—Joseph A. Walkowski
*Attorney, Agent, or Firm*—Pierce, Scheffler & Parker

[57] ABSTRACT

A method of fabricating an electrical circuit — usually employing small electronic components — on a generally rigid electrically conductive panel. The panel has apertures through which insulating collars are inserted, the necessary wiring and components then being built up on the panel by inserting the wires through the collars. The wires through each collar respectively are then united into electrical connection by crimping of the collars.

8 Claims, 3 Drawing Figures

ELECTRONIC CIRCUITS

BACKGROUND OF THE INVENTION

1. Field of the Invention

This invention relates to methods of fabricating electrical circuits, and in particular, but not exclusively, electronic circuits comprising — usually — a plurality of small interconnected components such as resistors, capacitors, transistors, and the like. The invention also extends to circuits fabricated by these methods.

2. Description of the Prior Art

At present, there are two small component circuit fabrication techniques in common usage. In one of these, electronic components (such as resistors, capacitors, transistors and so on, as well as simple connecting wires) are soldered to tags provided on a main chassis, or on a separate panel. The other technique employs a so-called "printed circuit", in which an insulating board having a circuit etched out of a metallic layer provided on one or both sides of the board is employed to interconnect electronic components soldered to the metallic layer at appropriate points. It is common with printed circuits to pass the tails (that is, the connecting wires of the components themselves) through suitable holes in the board, and then to solder only on the side of the board remote from the actual components.

In both of the above described techniques it is necessary to apply heat to complete the connections when soldering, and this may damage certain delicate electronic components such as transistors and other semiconductor devices. Also, the mechanisation of the production of circuits is difficult, and — particularly in the case of printed circuits — a modification in the design of the circuit is difficult to put into practice since a fresh photographic etching master has to be produced, as well as a revised drilling pattern of the board, in order to accommodate further components.

OBJECTS OF THE INVENTION

A primary object of this invention is to provide a method of fabricating an electronic circuit which is both simple and cheap to carry out. A further object is to provide a construction method which is flexible to design changes. Other objects and advantages will become readily apparent from the following description of the invention.

SUMMARY OF THE INVENTION

The method of fabricating an electrical circuit without the use of solder to a rigid conductive panel having a multiplicity of apertures extending therethrough, which method comprises the steps of:

inserting a plurality of sleeves of insulating material into the apertures of the panel in a predetermined array;

inserting from one side of the panel a like plurality of conductive collars in the said array through the sleeves of insulating material to provide a portion of each collar projecting upon the other side of the panel;

inserting wires in the required pattern through the collars from the said one side of the panel to make up the required electrical circuit;

uniting each collar with the wires passing therethrough by means of an inwardly crimping operation effected on said projecting portion of each collar thereby clamping the wires inserted into each collar into electrical connection with each other and mechanically retaining the wires and collars in position in the panel.

The wires may be simple connecting wires, or may be the tails of electronic components, as necessary to build up the required circuit on the panel.

The wires and collars are united by crimping the collars inwardly, and it is convenient if this crimping step is carried out on the side of the panel remote from the components themselves. The crimping of the collars may be effected one-at-a-time, but when the holes through which the collars are inserted are arranged in an ordered matrix, the crimping may with advantage be effected in rows, or even all the rows at once, by means of a suitable crimping device. Such a device, for instance, may have pairs of co-operable jaws which are closed together to crimp the collars located therebetween. It is found that radially inwardly crimping in certain directions causes the collars to expand radially slightly in other directions, and this locks the collars in the panel. The crimping of the collars therefore can form a permanent mechanical and electrical connection for all the components and simultaneously can mechanically attach the components to the panel.

An alternative to the method described above is to insert the collars into sleeves of insulating material prior to building up the predetermined array of collars on the conductive panel, the sleeves carrying the collars simultaneously being inserted into the apertures of the panel so as to build up the desired array.

The panel may be made of any substantially rigid or semirigid electrically conductive material. Such materials are normally metallic — and therefore strong — and are capable of serving as a chassis for the equipment employing the circuit; furthermore, they can also be used as a ground return for the circuit. For such purposes it is found that aluminum sheet is a particularly suitable material for the panel. Clearly, for those connections which are not to be connected to the panel, the collars themselves must be of an insulating material or be insulated from the conducting panel in order to avoid earthing the connections to the panel. It is convenient for such insulation to be provided by coating the panel with a plastics insulating material on one or both sides thereof and particularly on the wall defining the hole, so that components inserted through collars will not accidentally be grounded. If the panel is wholly coated with an insulating material it will be clear that a printed circuit may be provided on at least one of the sides of the panel or on the coating. In such a case, the connection of a component with a printed circuit can be made by means of a connecting wire, one of its ends being soldered to the printed circuit and the other of its ends being crimped with the collar with which the component is itself crimped.

The panel may be provided with holes only at the required location (as is the case with a conventional printed circuit) but it is preferred that the panel is provided with a matrix of holes over its entire area. In this case, only certain of the holes would be used, in order to allow assembly of the electronic components in the required array. If then it is required to modify the circuit, a further hole or holes may be used simply by inserting a collar or collars at the appropriate locations, to accommodate different or extra electronic components. Instead of holes, the panel may be provided with parallel rows of elongate slots. The arrangement is clearly similar to a panel having a matrix of round holes, except that there is a slightly greater freedom in the location of the collars.

Turning now to the collars themselves, it is preferred that at least the inner surface of the collars is electrically conducting in order to assist the connection together of the wires and tails passing through the collar. A metal collar may clearly be used with advantage since this can easily be crimped, but in the case which such a collar is used with an electrically conducting chassis, it will be necessary to insulate from the chassis those collars which connect together wires which it is not desired to ground to the chassis. Such insulation may be provided by a plastics coating or by some other coating such as rubber over the outer surface of the collar, or by the collar being inserted into a sleeve which sleeve itself passes through and engages the hole in the panel. However, when it is desired to ground a particular connection to the chassis, the insulating sleeve or coating should be omitted. Moreover, if the collar is provided with ribs or other projections on its outer surface, the quality of the connection to the chassis may be improved by the areas of localised pressure produced when such a collar is pressed into a hole in the chassis.

In certain chassis fabrications using electrically conducting panels, it may be advantageous to use collars of a plastics material so that an insulating sleeve may be omitted, but in order to obtain a good electrical connection between the tails and wires passing through the collar, it is preferred that the inside of the collar to be covered with a conducting material, such as metallic foil.

It is preferred that the end of the collar lying on the same side of the panel as the components to be connected together is flared. In this way, if it is required to replace one component by another (for instance, to replace a faulty component), or to add an extra component, at a particular collar, a pool of solder may be run around the joint in the flared end, and hence a simple soldered connection may be made.

Any of the collars described above may be fitted, before interlocking, with a retainer on the side of the panel remote from the electronic components being connected together in order to hold the collar in position after interlocking. Such a retainer may comprise a locking washer having inwardly directed teeth which engage the outer surface of the collar.

According to a further aspect of the invention, there is provided a fabricated electronic circuit whenever produced by any of the above described methods of this invention.

BRIEF DESCRIPTION OF THE DRAWINGS

In order that the invention may be well understood, it will be explained further, with reference to the accompanying drawings, in which.

DESCRIPTION OF THE PREFERRED EMBODIMENTS

Figure 1:
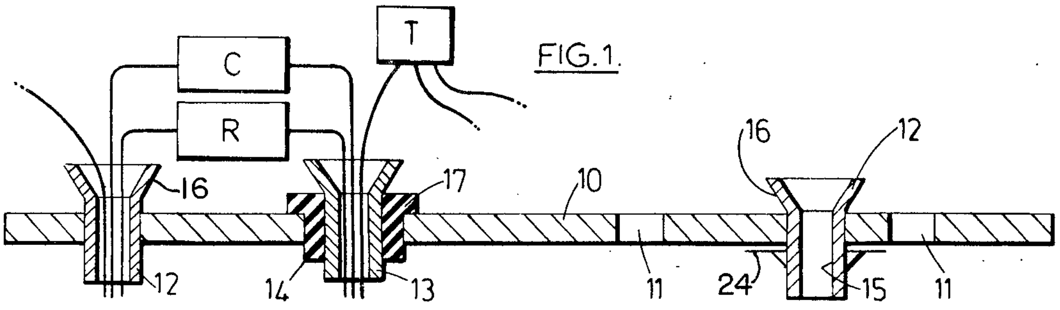
FIG. 1 is a cross-sectional view through a panel carrying a circuit fabricated in accordance with the invention.

Referring to FIG. 1, a metallic panel 10 is shown having a plurality of holes 11. Through certain of the holes are inserted either metallic collars 12 making direct connection with the panel 10, or metallic collars 13 each having an insulating sleeve 14 (such as of plastics) therearound, the sleeves 14 making contact with the panel and insulating the collars 13 therefrom. The holes 11 may be arranged in a particular array in the panel to suit the circuit to be mounted thereon, but it is preferred to have an ordered matrix of holes, and then insert the collars 12 or collars 13 and sleeves 14 in the required array into the holes.

Each collar 12 has a cylindrical bore 15 terminating at one end in a flared portion 16. The outer surface of the collar 12 adjacent the parallel bore 15 is a press-fit in a hole 11; however, this outer surface may be tapered slightly in order to wedge the collar tightly in a hole. The collars 13 are of similar shape to the collars 12, but the outer diameter adjacent the parallel bore is smaller in order to leave clearance between a hole and the collar for accommodating a sleeve 14. The sleeves 14 are cylindrical, with a flange 17 at one end. The flanged end is located on the same side of the panel as the flared end of the associated collar.

Electronic components, such as a resistor R, a capacitor C and a transistor T are then arranged with their tails (connecting wires) passing through the collars so as to make up the desired circuit, all the components being on the same side of the panel 10 as the flared ends of the collars. It is convenient if, at least, the capacitors and resistors lie parallel to and spaced from the surface of the panel, the tails being bent through 90° in order to pass through the collars. Any other required simple connecting wires may also be passed through the required collars at this stage.

All of the collars are then crimped with a suitable tool from the side of the panel remote from the components. Although this can be effected one collar at a time, in the case of an ordered matrix of holes arranged in rows it is preferred for production efficiency to crimp all of the collars in each row simultaneously. This is best effected by having a tool with a pair of elongate jaws, the collars of one row being located between the jaws and the jaws then being moved together. In cases when speed of fabrication is most important, simultaneous crimping of all the collars may be effected. This can be carried out by having as many pairs of jaws as rows and then effecting movement of all of the pairs.

During crimping, the collars are distorted so that the wires passing therethrough are united with one another and with the respective collar itself; thus a permanent mechanical and electrical connection is obtained. Furthermore, radially inward crimping of the collars also causes some radially outward distortion thereof, which thus prevents the collars from being withdrawn through the holes. The fabricated circuit is thus mechanically locked on to the panel 10.

If it is desired to change a particular component, or to add a further component to the circuit, a pool of solder may be run around the flared ends of the collars which the component is to interconnect, and then the component itself can be soldered into the required collars. A component to be removed is simply cut out by snipping through its tails.

It will be appreciated that in the above described fabricated circuits, the collars 12 connect directly to the metallic panel, and consequently all components united in any of the collars 12 are effectively connected to the chassis and thus to each other. The panel 10, as well as serving as ground return, may also serve as a chassis for the equipment using the fabricated circuit, and it is found that aluminium is a particularly suitable material for this purpose. In this case, the chassis may be preformed to a particular shape, or may have all of the components mounted thereon and then be bent to take up the required shape.

In order to increase the security of the mechanical attachment of the fabricated circuit, locking washers may be provided on the collars on the ends thereof remote from the flared ends. Such a locking washer may take the form of a spring-steel washer having a plurality of radially inwardly directed teeth, the teeth digging into the outer surface of the collar as the washer is pressed thereon. Such a washer is shown at 24 fitted on the right-hand collar 12 in FIG. 1.

Figure 2:
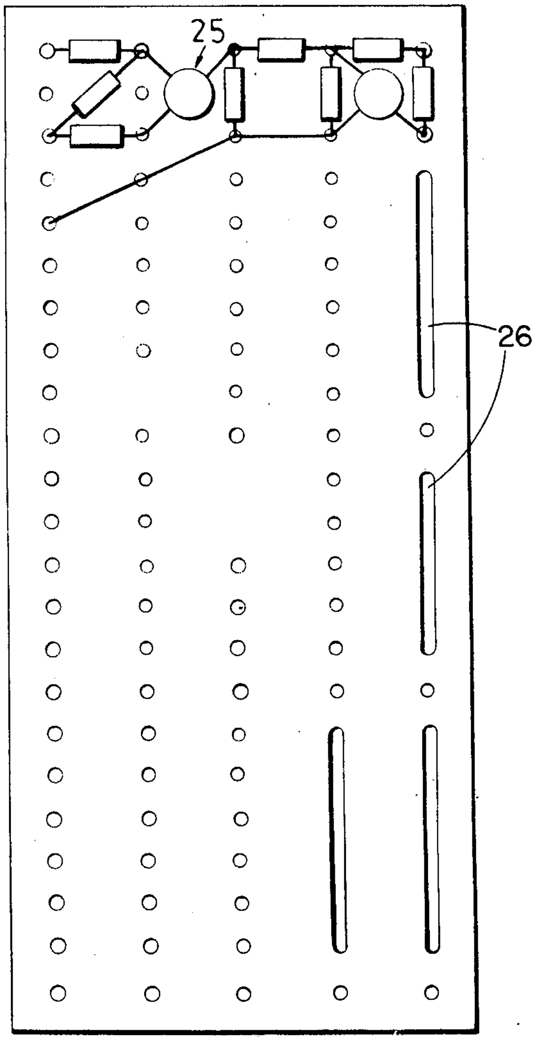
FIG. 2 is a plan view of another panel.

FIG. 2 is a plan view of a panel having part of a circuit 25 already fabricated thereon in accordance with the invention. Instead of round holes, the panel may be provided with elongate slots, as shown at 26, the collars being located in the slots in a similar way as in the holes. This arrangement gives slightly greater freedom in the location of the collars than is the case with an ordered matrix of holes.

Figure 3:
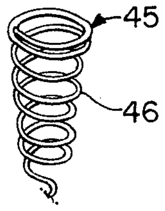
FIG. 3 is a side view of another form of collar.

FIG. 3 shows a further form of collar which may replace those already described. This collar is especially suitable when wires of widely differing diameters are to be connected together. The collar of FIG. 3 comprises an open conical coil 45 of metal wire 46 which is insertable into the holes in the panels. When this coil is crimped, it is found a particularly good connection is made between the tails and wires passing therethrough.

It will be appreciated that in any of the above described embodiments, a complete circuit may be fabricated without the use of solder. In addition further components may be added to a circuit in a simple manner. In the case of a production run, the method of fabrication lends itself to mechanised techniques, and is flexible to design changes without incurring great cost in incorporating extra components or wiring.

What is claimed is:

1. The method of fabricating an electrical circuit without the use of solder to a rigid conductive panel having a multiplicity of apertures extending therethrough, which method comprises the steps of:

inserting a plurality of sleeves of insulating material into the apertures of the panel in a predetermined array;

inserting from one side of the panel a like plurality of conductive collars in the said array through the sleeves of insulating material to provide a portion of each collar projecting upon the other side of the panel.

inserting wires in the required pattern through the collars from the said one side of the panel to make up the required electrical circuit;

uniting each collar with the wires passing therethrough by means of an inwardly crimping operation effected on said projecting portion of each collar thereby clamping the wires inserted into each collar into electrical connection with each other and mechanically retaining the wires and collars in position in the panel.

2. The method claimed in claim 1 and in which the apertures in the panel are arranged in an ordered matrix, which method further comprises the step of crimping of all of the collars in a row thereof simultaneously.

3. The method claimed in claim 2, in which the crimping of each row of collars in the matrix thereof is effected simultaneously.

4. The method claimed in claim 1, which includes, after inserting the collars into the apertures, the step of fitting a retaining washer over the said projecting portion of each collar so as to restrain removal of the collar from the aperture.

5. The method of fabricating an electrical circuit without the use of solder to a rigid conductive panel having a multiplicity of apertures extending therethrough, which method comprises the steps of:

inserting a plurality of conductive collars respectively into a like plurality of sleeves of insulating material;

inserting from one side of the panel the conductive collars and sleeves of insulating material in a predetermined array to provide a portion of each collar projecting from the other side of the panel, each collar being insulated from the panel by the sleeve of insulating material located therearound;

inserting wires in the required pattern through the collars from the said one side of the panel to make up the required electrical circuit;

uniting each collar with the wires passing therethrough by means of an inwardly crimping operation effected on said projecting portion of each collar thereby clamping the wires inserted into each collar into electrical connection with each other and mechanically retaining the wires and collars in position in the panel.

6. The method claimed in claim 5 and in which the apertures in the panel are arranged in an ordered matrix, which method further comprises the step of crimping of all of the collars in a row thereof simultaneously.

7. The method claimed in claim 6, in which the crimping of each row of collars in the matrix thereof is effected simultaneously.

8. The method claimed in claim 6, which includes, after inserting the collars into the apertures, the step of fitting a retaining washer over the said projecting portion of each collar so as to restrain removal of the collar from the aperture.

* * * * *